US009728289B1

(12) United States Patent
Poggi et al.

(10) Patent No.: US 9,728,289 B1
(45) Date of Patent: Aug. 8, 2017

(54) PASSIVE RADIATION SHIELD

(71) Applicants: Oscar Santiago Poggi, Turin (IT); Martin Pablo Vecchio, Miami beach, FL (US)

(72) Inventors: Oscar Santiago Poggi, Turin (IT); Martin Pablo Vecchio, Miami beach, FL (US)

(73) Assignees: Oscar S. Poggi, Turin (IT); Martin P. Vecchio, Miami Beach, FL (US)

( * ) Notice: Subject to any disclaimer, the term of this patent is extended or adjusted under 35 U.S.C. 154(b) by 0 days.

(21) Appl. No.: 15/077,365

(22) Filed: Mar. 22, 2016

(51) Int. Cl.

| | |
|---|---|
| ***G21F 1/00*** | (2006.01) |
| ***G02B 5/30*** | (2006.01) |
| ***H05K 9/00*** | (2006.01) |

(52) U.S. Cl.

CPC ............. *G21F 1/00* (2013.01); *G02B 5/3008* (2013.01); *H05K 9/0079* (2013.01); *H05K 9/0088* (2013.01)

(58) Field of Classification Search

CPC ..... G21F 1/00; G21F 1/02; G21F 9/00; G21F 9/12

USPC ......... 250/505.1, 506.1, 515.1, 516.1, 517.1, 250/518.1, 519.1

See application file for complete search history.

(56) References Cited

U.S. PATENT DOCUMENTS

| | | | | |
|---|---|---|---|---|
| 4,870,424 A * | 9/1989 | Lalezari | H01Q 3/14 | 342/159 |
| 2006/0104319 A1* | 5/2006 | Smith | G01J 1/42 | 372/21 |
| 2011/0001065 A1* | 1/2011 | Popa-Simil | B82Y 10/00 | 250/505.1 |

* cited by examiner

*Primary Examiner* — Nicole Ippolito

(57) ABSTRACT

The Radiation shield comprises one or more passive elements. A material having a high internal electric field is used to intensify the shielding effect. The material internal electric field generates a force that slows and/or diverts the incoming particle. The charged particle transfers kinetic energy into the shielding material. The charged particle slows down/diverts away from the protected direction. The incoming particle also interacts with the material transferring energy through traditional interactions. The path of the particle within the protective material can be lengthen. The shield can be combined with other passive shields that would maximize the electric deceleration effect and absorbs energy from the incoming particle. The shield can take different shapes, textures and colors, can also be included into other materials and its material be used for dual purposes.

13 Claims, 8 Drawing Sheets

PASSIVE RADIATION SHIELD

FIELD OF THE INVENTION

This invention relates to radiation shielding. In particular, it relates to the use of a passive shield with a performance increased by a material that has an internal electric field.

BACKGROUND OF THE INVENTION

Space is full of ionized matter travelling at significantly speeds (mostly protons and electrons in plasma state, but also heavier ions like He, Fe and others). We usually call this matter: ionizing radiation. The principal constituent of energy in this particles is kinetic energy.

As radiation passes through matter, it may undergo changes in its composition and energy by means of transformation or exchanging energy with other particles. When it arrives to a body it could pass through it and/or it could interact with it. The effects can be damaging to beings and objects and may result in death, disease, impairment, destruction and improper function. Active and passive shielding are used to stop or reduce the effects of radiation over an specific target. In the case of active shielding, the desired result is to stop or deflect away the incoming particle from the protected target. For active shielding, mainly electrostatic fields and magnetic fields have been proposed. Active shielding has been use to some extent, yet the size, energy consumption and mass of these systems has reduced their use to a very specific applications. Their effectiveness depends on the strength of the field, the distance over which the field acts, and the rigidity of the radiation particle.

The intrinsic problems of active electrostatic shielding are the relatively low field strength, the need for active power to run it, and the requirement for huge mass and volume allowances. Usually active electrostatic shielding requires dimensions hundreds of meters and mass of several tons of steel, making it unpractical.

Magnetic active shielding also requires heavy equipment, superconductors to build magnets and is highly power demanding.

Ionizing radiation shielding schemes have, so far, relied mainly on passive shielding. For radiation formed out of non charged particles are—so far—the only way to mitigate or stop the effects.

Traditionally, passive shielding objective has been to absorb into the shield the energy that would have damage the protected target. Passive shielding is widely used due to its simplicity, the lack of constant energy requirements and its foreseeable performance.

Some attempts have been made in the past to improve passive shielding by including magnetic particles within the material, yet the results have not shown significant improvements. Also, when using magnetic elements to alter the direction of the incoming particle, the behaviour of the shield is asymmetric. Depending the trajectory angle of the incoming particle, the magnetic field could deflect radiation towards the target instead of away from it. This effectively limits its use to cases where the radiation particles direction can be established in advance.

Passive shields can generate secondary radiation such as other particles, gamma rays and neutrons that may not be diverted. Passive shielding attenuates radiation by slowing and moderating it, resulting in the deposition of the radiation's energy in the passive shield and possibly resulting in the complete capture and absorption of the radiation. The success of passive shielding depends upon the stopping power of the shield. This value is a function of the number of interactions with atoms or their parts. The probability for interactions is dependent on the length of the path travelled by the ionizing radiation through the shield. The longer the path that the particle travels, greater is the opportunity for the passive shield to moderate and absorb the radiation. The main drawback of passive shielding is the necessity of very big, dense and/or heavy shields to guaranty enough interactions between the radiation particle and the shield. Also, for certain materials the production of secondary radiation (neutrons, electromagnetic radiation and charged particles) can significantly worsen the effect on the target.

SUMMARY OF THE INVENTION

The object of the invention is to provide an effective shield that combines the traditional shielding effects of the material—working against the full spectrum of radiation—with passive electrostatic shielding. The electrostatic effect is aimed to provide enhance shielding properties against radiation involving charged particles. There are not active elements performing shielding.

The space between atoms is usually empty and the chance for interactions between the travelling ionizing radiation and the shield depends on its distance to the nuclei and electrons forming the shield. Inside the material there are significant electric fields formed by interactions between protons and electrons yet for materials commonly use the value for the average electric field of a macroscopic sample is zero. The consequence is that, on a material electrically neutral, the average effect of the internal electric fields over the radiation particle when travelling through the empty space between the shield constituents is usually negligible.

The proposed shield is formed by a material that has an strong average directional electrostatic field within the internal empty space. Since the radiation has an electric charge it will be accelerated following the electric field lines. By positioning the electric field lines on a particular direction, the radiation will experience a net force that can be use to protect a target.

If the electric field lines and the velocity of the incoming radiation are parallel and opposite directions, the radiation particle will slow down. As a secondary result of the interaction of the ionized matters with the shield, there is a reaction force exerted on the shield If the travelling direction of the radiation is not parallel to the field lines, the particle will experience an average electric force and an acceleration that will modify its velocity only in the direction of the field. The component of its velocity in the perpendicular direction to the electric field will remain unaffected, hence the trajectory will be changed. This effect can be use to increase the time the particle remains inside the material of the shield increasing the probability for collision interactions.

If the particle were to enter the field at a 90 degree angle, the particle will be diverted from its path without any speed variation in component of the direction of its original trajectory. This configuration can be use to divert the radiation away—in particular when the radiation incoming direction is known in advance.

The shield includes polarized dielectric material. The material used for shielding is selected to maximize the combined effect of an internal electric field and a traditional passive shielding. The total electric net charge of the shield is zero. The internal charges (natural or artificially bounded)

are arranged in a way to create electric dipoles forming an average internal electric field that is proportional to the polarization vector.

There are several materials that are suitable and can be chosen depending on each particular case. Among them we find: Electret and Ferroelectric materials, piezoelectrics, pyroelectrics, polar crystalline and semicrystalline polymers, crystals, salts, ceramics, materials non naturally polar yet polarized by charge accumulation and many others. A specific solution has to be tailored based on a case by case analysis. The solution, including one or a combination of materials will depend on the specific type of radiation, type of ions or electrons that constitute the radiation, energy levels of the radiation, flux, desired level of protection, expected period of service and other variables.

There are materials that are naturally polarized, for instance quartz. There are piezoelectric materials and electret materials that will be suitable. Other types of materials likely to be use are from the family of ferroelectric (where they can be polarized at will to a specific state and will remain in a stable way in such state). Certain semicrystalline polymers also present this property, while fully crystal polymers can be permanently polarized on the same specific direction. Other non polar materials can be permanently specifically charged to produce the desired effect while remaining macroscopically electrically neutral.

If the energy of the radiation is such to be able to produce secondary radiation, the chemical elements forming the shield should be chosen to have low atomic numbers and low relative cross sections to reduce the probability of nuclear reactions with the incoming radiation. It is recommended to utilize elements with high quantities of Hydrogen and Carbon that reduce the risk of secondary radiation and could capture neutrons. Polyethylene is commonly use, yet there are several polymers that can be produce with directional polarization and might be more effective.

In the more general case it is possible to use different layers of material, where the combination of different layers will allow to minimize the overall thickness, volume, mass and/or secondary radiation production hence creating a more effective solution.

Since electrically charged particles could accumulate inside the material, it might be necessary to include between different layers of the shield a conductor material that will allow for electrons to travel—to or from—the inner sections and avoid dielectric breakdown which will produce material rapid deterioration. By having shorter paths, the electrons will migrate faster to the trapped particle and neutralize the effect of charge growth. This solution will have to be carefully designed to prevent the neutralization of the internal electric field.

Some dielectrics (for instance semicrystalline polymers) could be subject to depolarization due to working temperature being outside the design range or other factors. Yet, it is sometimes possible to repolarize the material (PVDF, a terroelectric polymer has a very stable strong polarization that can be re-set by using an external field), so it can be included in the design of the shield the function to repolarize the ferroelectric material. The repolarization can be achieved using conducting layers to restore some of its lost properties (note that this will not make it an active shield, just a maintenance on demand function, in fact, while on maintenance mode the performance of the shield will be reduced). Again, adding conducting layers has to be done in a way that prevents the neutralization of the internal electric field on the dielectric.

The method of construction the shield is to place one or more layers of the protective material to build up thickness. The orientation of the electric field is aimed to create a force on the incoming particle to produce the desired protection by deflecting it, reducing its speed or both effects combined. Within the material and/or between each layer, very thin conductors or layer of conductors could be place to allow electrons to reach positively ionized particles and keep the total system charge neutral. For the repolarization capacity it might be necessary a more complex design with multiple conductor layers separated by non polarized dielectric. Any extra material will act as traditional passive shielding and it could be selected based on the specific requirements (for instance to increase the protection against neutron radiation or/and others).

Since the system would allow to adopt different shapes and can have diverse physical properties (colour, structural strength, emissivity, flexibility, etc) it is possible to engineer the protection into the fabrication of components and parts for multiple purposes. The protective material can be use to produce flexible cloth or a rigid container, it can be shape out of the layers, it can be bond together, it can be weave into fabric, etc. For instance if a container were to be produce using shielding material, the space inside would be protected from external radiation, or, the radiation source could be placed inside and the exterior would be protected from it (note that for each case the protection offered by the electric field is directional and non isotropic).

It is possible to include this protection into other materials serving other functions. For instance, in the case of building a structure using composite materials, i.e. carbon fiber, the resin used can be saturated with particles of polarized material aligned in the desired way to produce protection while the fibers would act as conducting material. Alternatively, the resin itself can be treated and polarized to achieve the protection.

To increase protection, the system can be scaled or stacked until obtaining the desired radiation reduction and combine with other passive or active systems.

The polarization of the material could create positively and negatively bounded charged surfaces on each side of the shield. It might be necessary to cover the final layers with a thickness of non polarized material that would prevent particles with opposite charge to attached to the surface reducing the effect.

EXAMPLE

Protection against incoming radiation directed towards the target. The protection is placed with the electric field parallel to the path of the incoming radiation, therefore no deflection effect is to be considered. No radiation reduction due collisions is considered. The effect of the graphite shielding is not considered. The materials mentioned in this example are among a wide variety of possibilities and are chosen to exemplify the idea.

Layer type 1: Partially Polarized Polymer PVDF, thickness 0.5 mm. Average Internal Electric field 50 kV/mm. Density 1.8 gr/cm3.

Layer type 2: conductive graphite connected to ground, thickness 0.05 mm Density 2.09 gr/cm3

Total Number of pair (layer1, layer2) stack over each other: 100,

Total thickness of polarized material=50 mm,

Total thickness of the protection=55 mm.

Electric force effect:

(Force on the particle)=(particle charge)*(Electric field)=(particle mass)*(particle acceleration.)

IE: Source of Radiation, Galactic Cosmic ray,

Nitrogen nuclei: ${}^{7}{}_{14}N^{7+}$

Electric charge: 1.1214 E-18 Coulomb, mass: 2.326 E-26 kg,

Electric Field: 5 E7 V/m

Force: 1.1214 E-18 Coulomb*5E7 V/m=5.067 E-11N

Work done by electric force=energy reduction of particle: 2.8035 E-12 Joule=17.5 MeV

Figure 1:
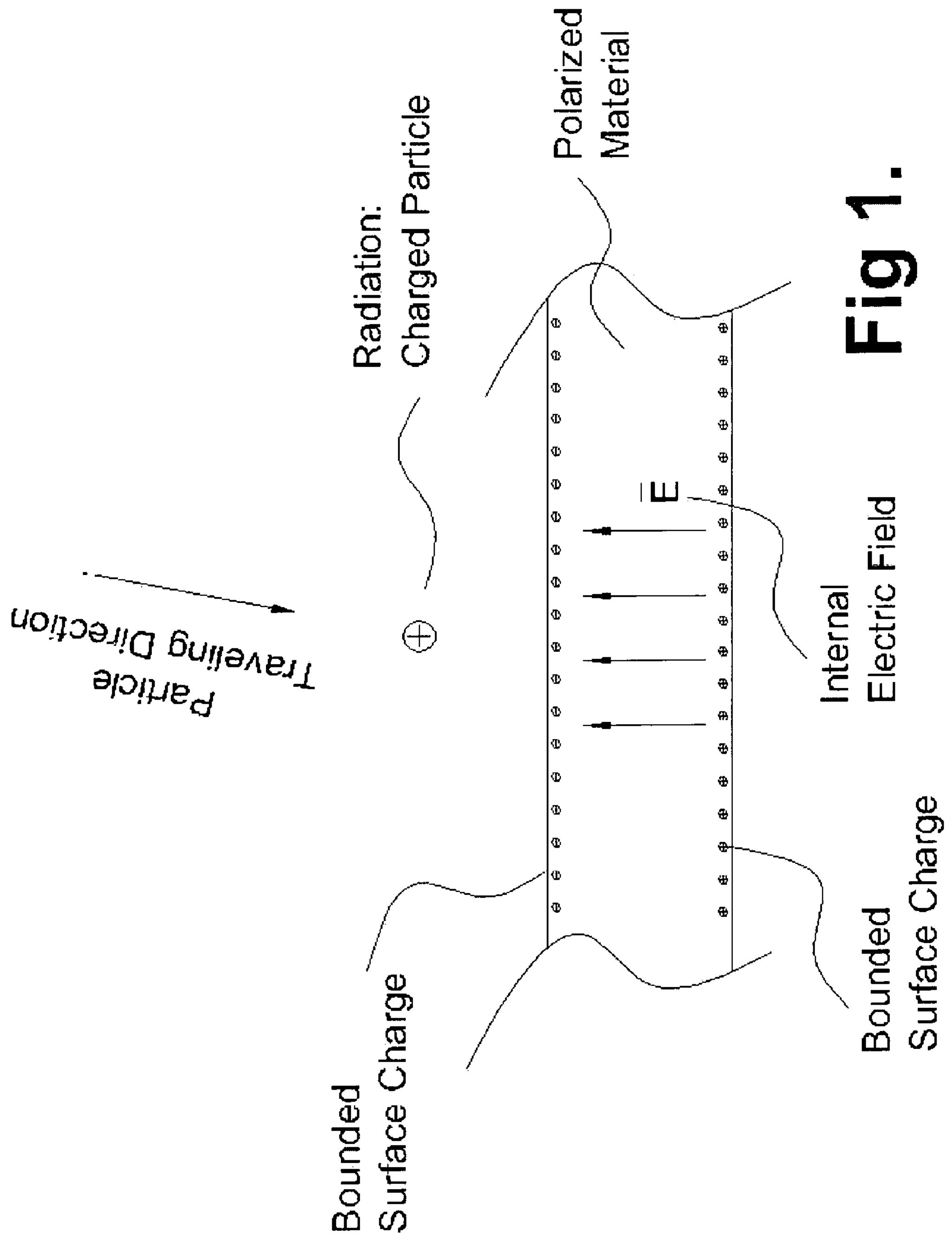
FIG. 1. Radiation particles moving towards the basic shielding unit.
Figure 2A:
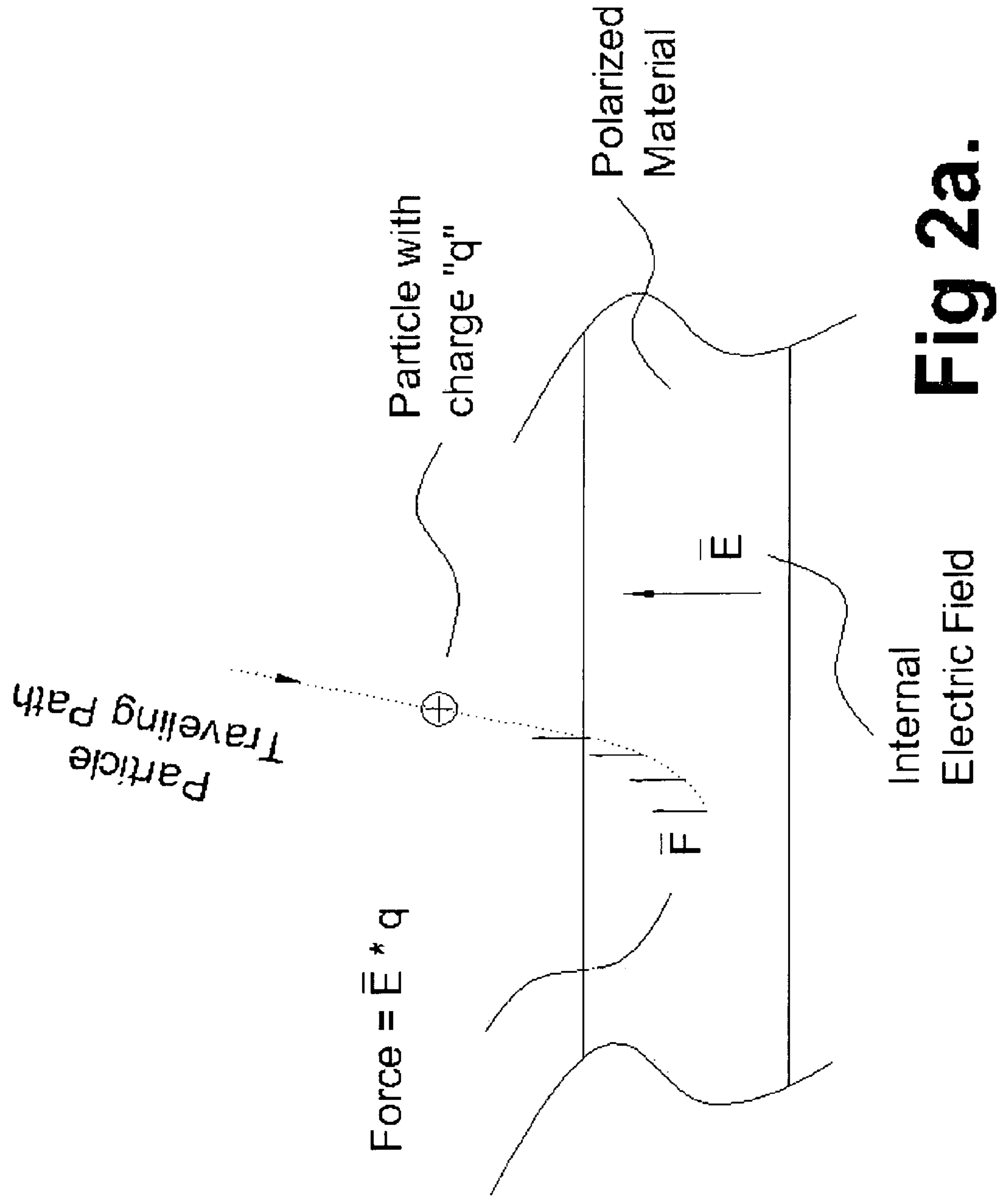
FIG. 2*a*. Trajectory in the material, the force acting is stopping the particle.
Figure 2B:
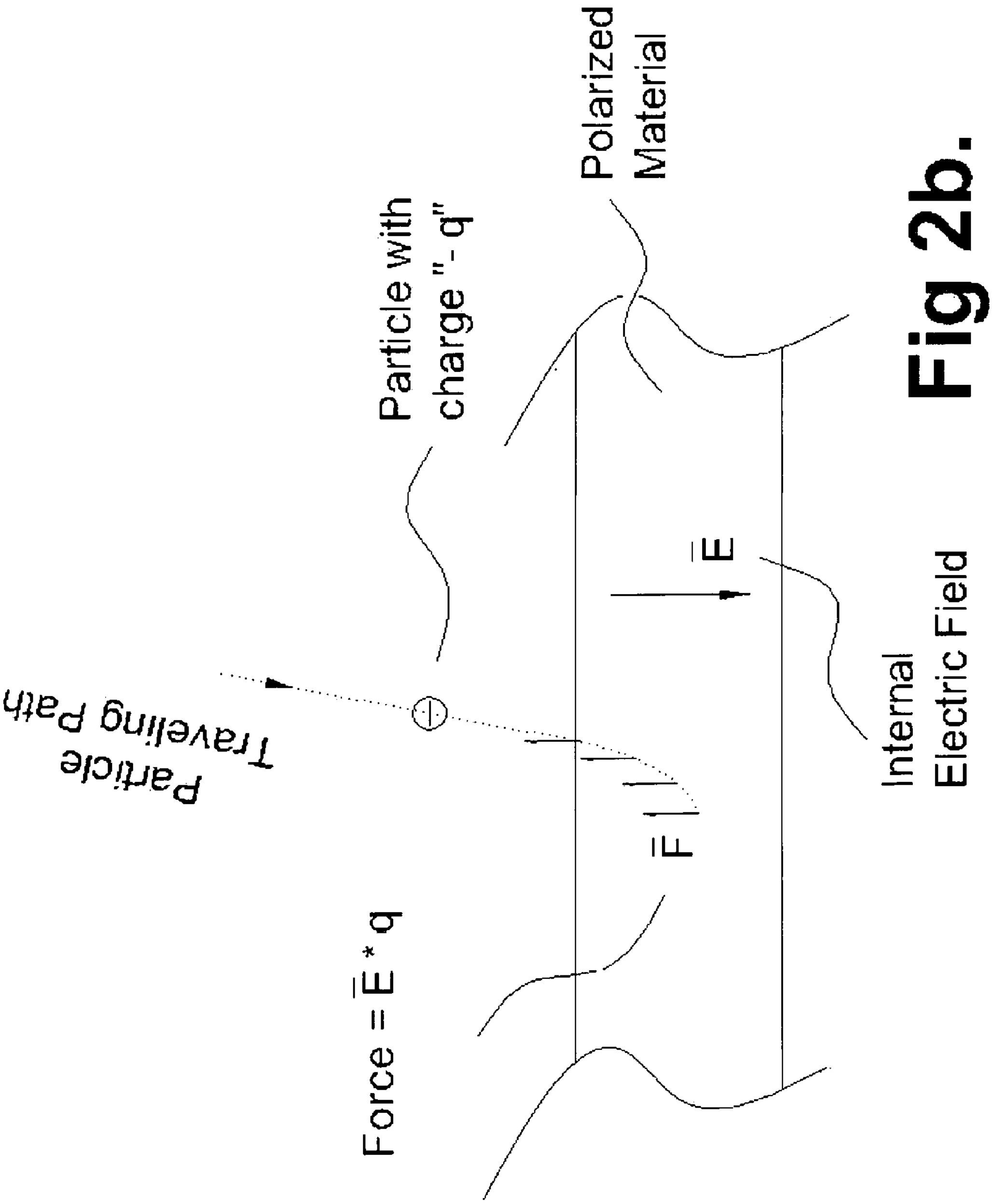
FIG. 2*b*. Shield configuration for protection against negatively charged particles.
Figure 3:
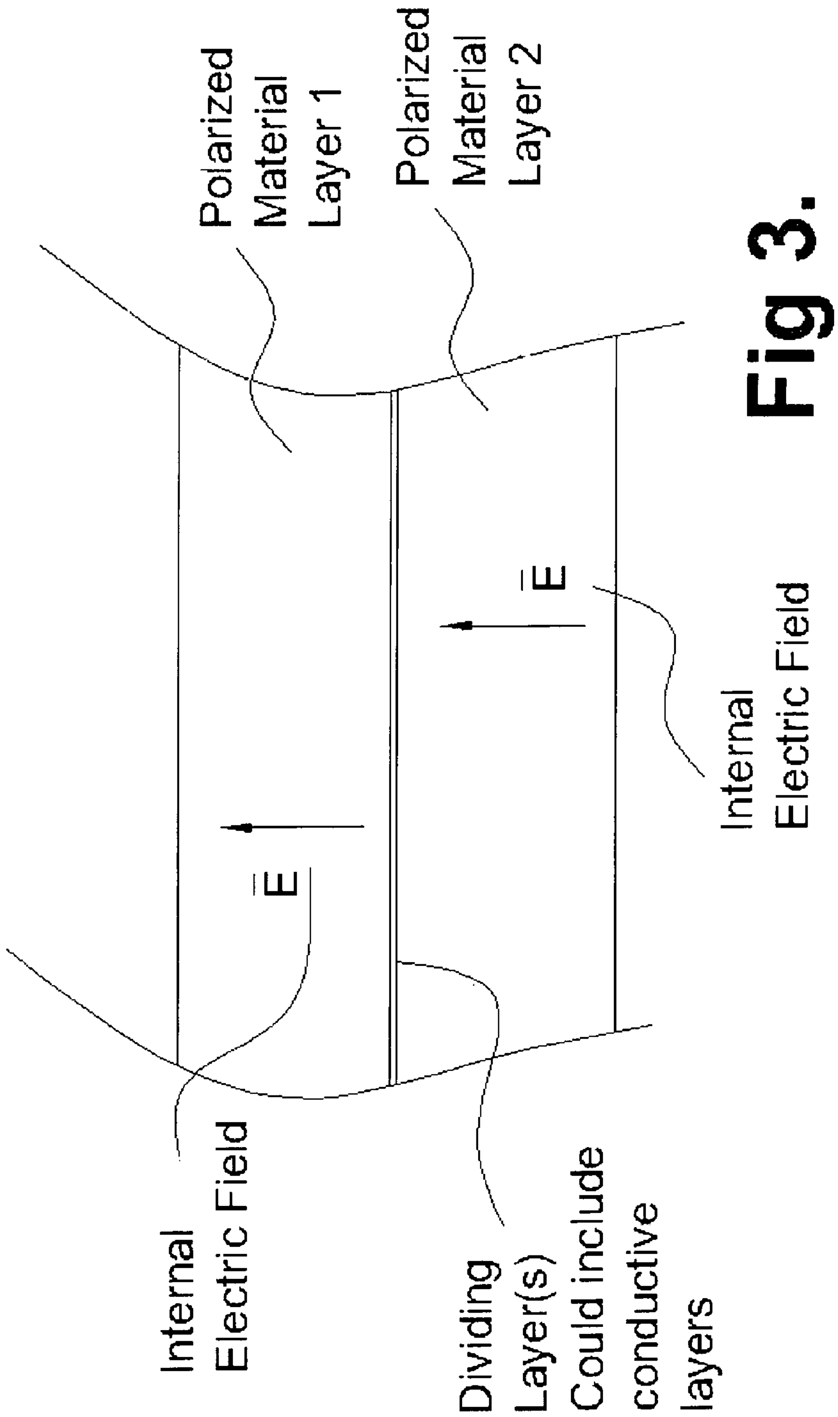
FIG. 3. Multiple Layers Configuration. Separating Layer(s) shown.
Figure 4:
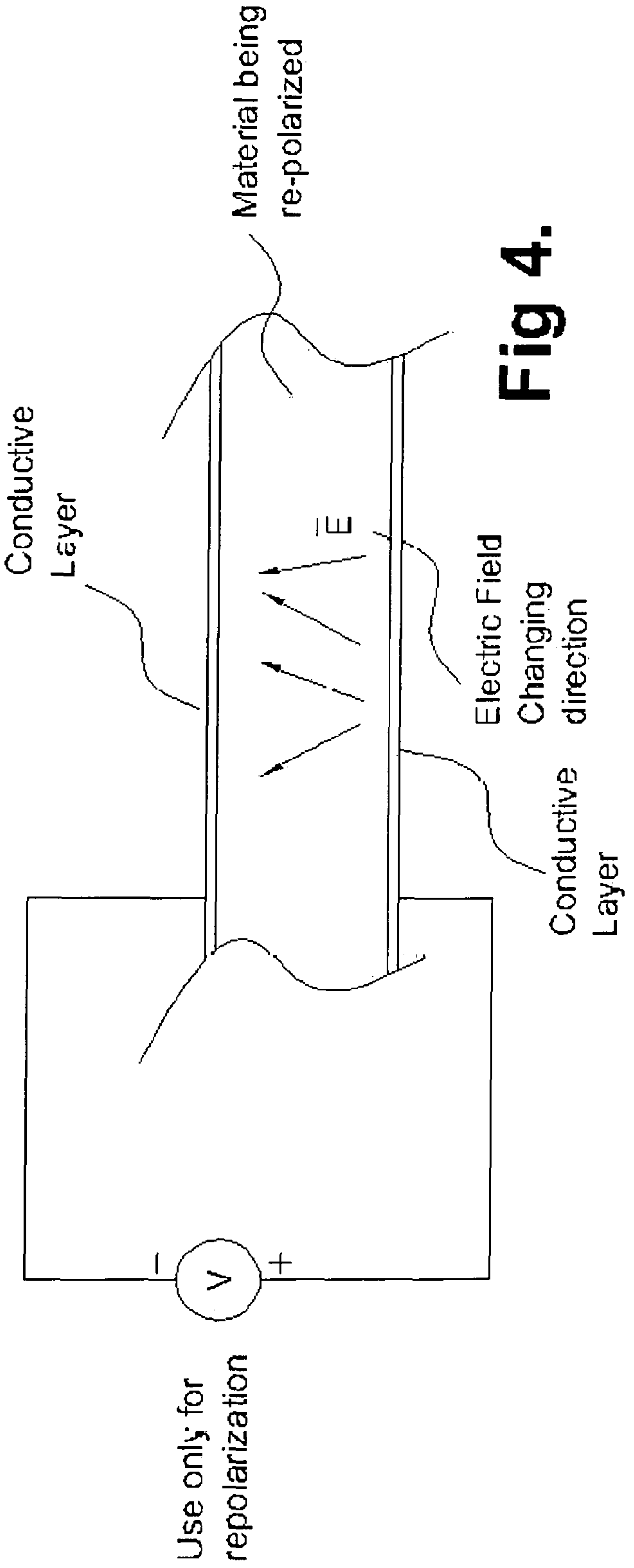
FIG. 4. Re-polarization of the material using the conducting layers.
Figure 5:
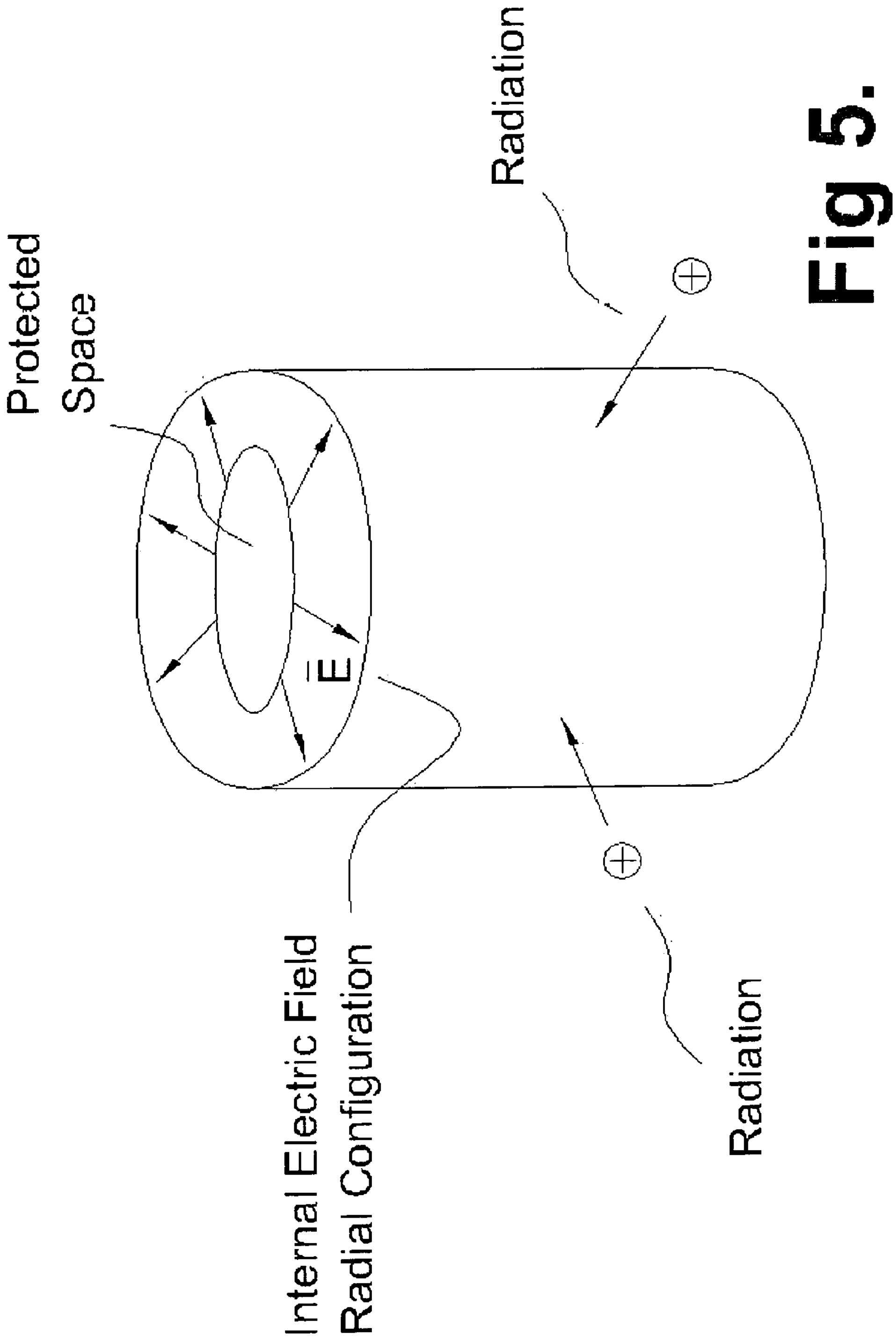
FIG. 5. Receptacle with protected internal space.
Figure 6:
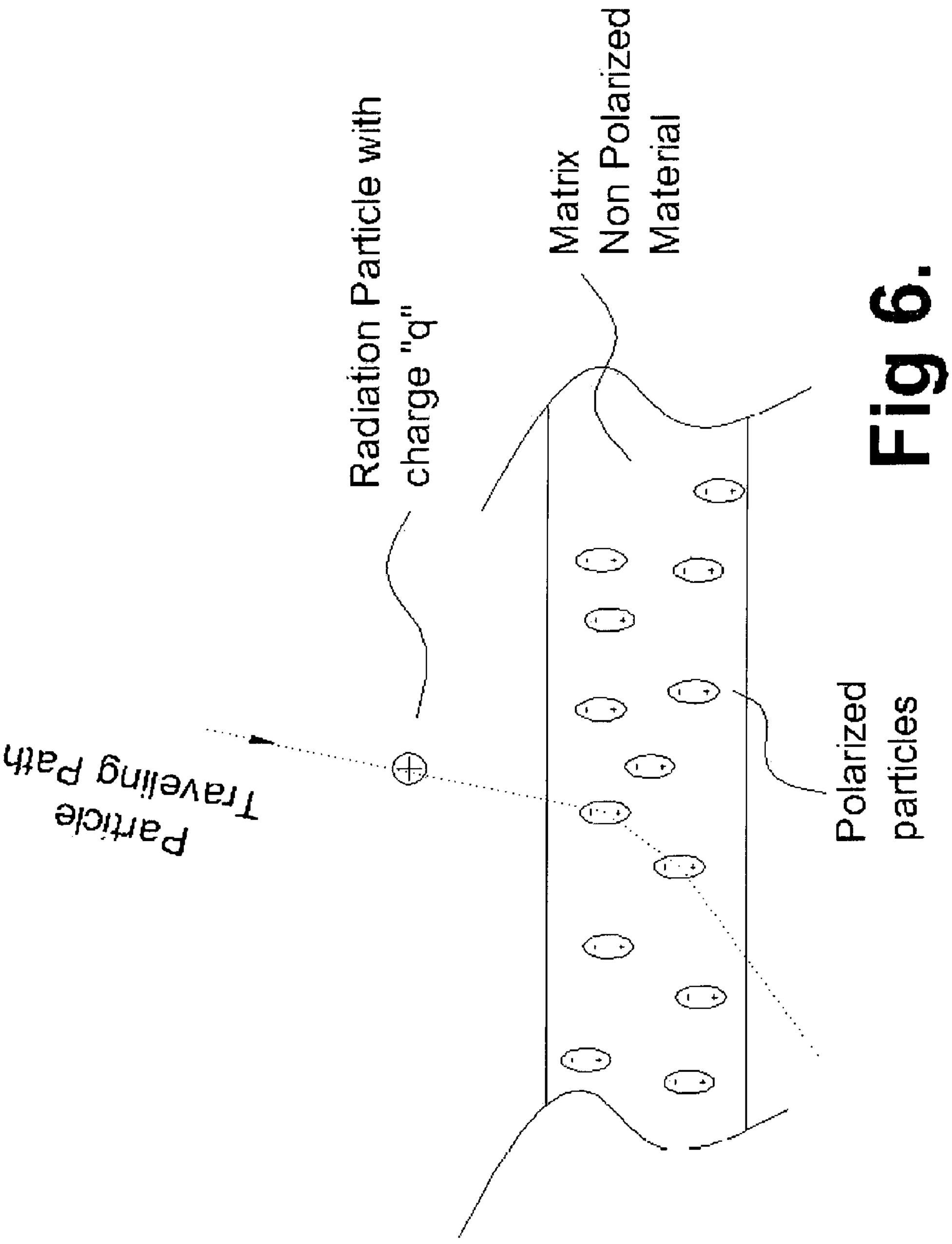
FIG. 6. Composite material form by a matrix containing polarized particles.
Figure 7:
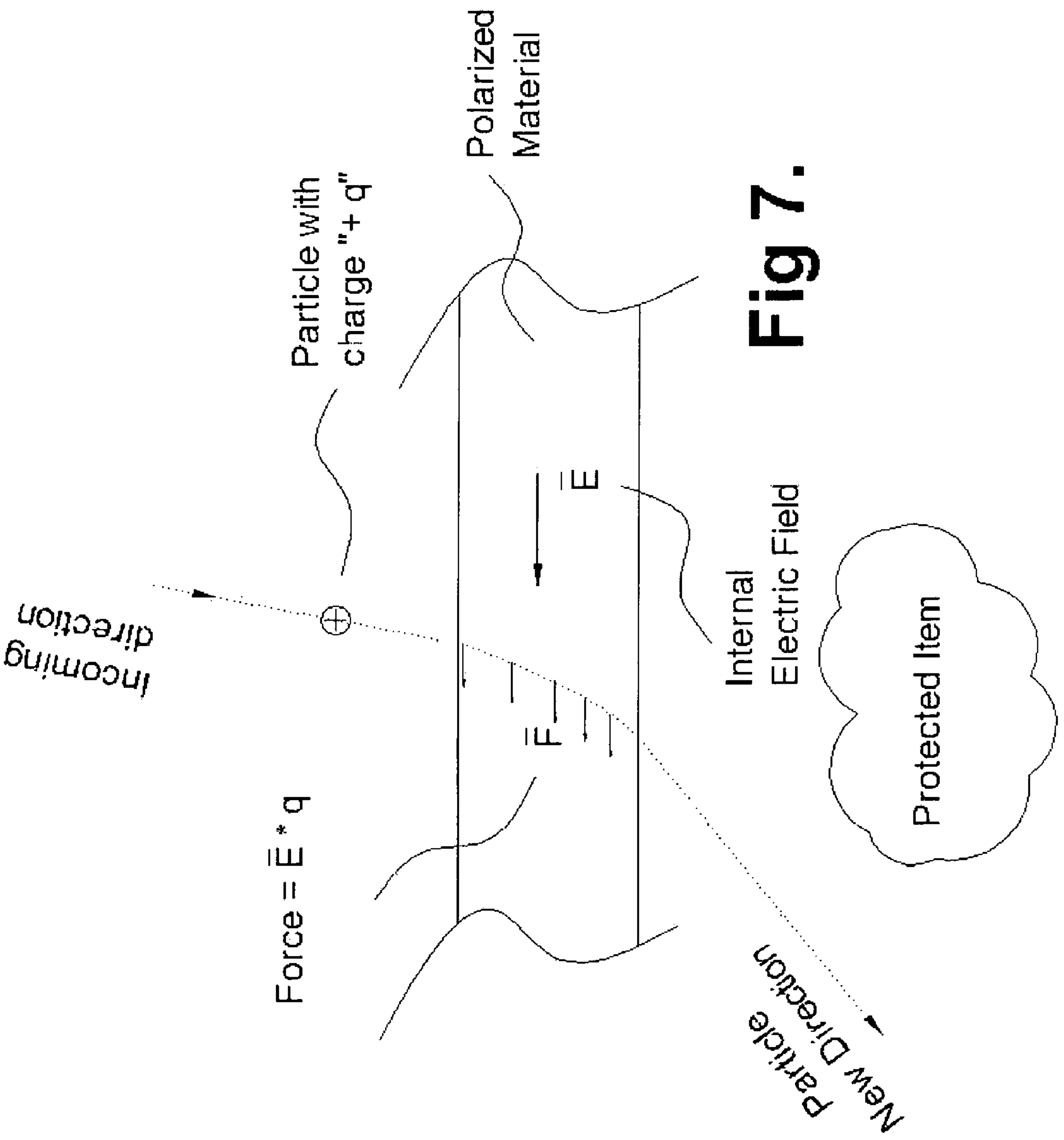
FIG. 7. Deflecting shield configuration.

The invention claimed is:

1. A shielding system that comprises at least one layer containing or formed by a polarized dielectric material that posses an electric field that will divert or slow incoming charged particles providing an enhanced passive shielding against ionizing and non ionizing radiation by means of interactions between the incoming radiation and the electric field.

2. The system in claim 1 wherein it is combined with one or more layers of non polarized dielectric material to create a composite.

3. The system in claim 1, wherein it is combined with conductive material to create a composite.

4. The system in claim 2, wherein it is combined with conductive material to create a composite.

5. The system claim in 3 wherein the conductive material is used to repolarise the enhanced material.

6. The system claim in 4 wherein the conductive material is used to repolarise the enhanced material.

7. The system claim in 3 wherein the conductive material is used to eliminate accumulated charges in the material.

8. The system claim in 4 wherein the conductive material is used to eliminate accumulated charges in the material.

9. The system in claim 1 where the material can be polarised in different directions to provide protection against positive or negative charge particles.

10. The system in claim 2 where the material can be polarised in different directions to provide protection against positive or negative charge particles.

11. The system in claim 3 where the material can be polarised in different directions to provide protection against positive or negative charge particles.

12. The system in claim 4 where the material can be polarised in different directions to provide protection against positive or negative charge particles.

13. The system in any one of claims 1-12 wherein said system is to be a constitutive part of a larger shielding system.

* * * * *